US010446213B1

(12) United States Patent
Zhang et al.

(10) Patent No.: US 10,446,213 B1
(45) Date of Patent: Oct. 15, 2019

(54) BITLINE CONTROL IN DIFFERENTIAL MAGNETIC MEMORY

(71) Applicant: Everspin Technologies Inc., Chandler, AZ (US)

(72) Inventors: Yaojun Zhang, Austin, TX (US); Syed M. Alam, Austin, TX (US); Thomas Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/980,977

(22) Filed: May 16, 2018

(51) Int. Cl.
*G11C 11/00* (2006.01)
*G11C 11/16* (2006.01)

(52) U.S. Cl.
CPC ........ *G11C 11/1675* (2013.01); *G11C 11/161* (2013.01); *G11C 11/1659* (2013.01); *G11C 11/1673* (2013.01); *G11C 11/1697* (2013.01)

(58) Field of Classification Search
CPC .............. G11C 11/1675; G11C 11/161; G11C 11/1673; G11C 11/1697
See application file for complete search history.

(56) References Cited

U.S. PATENT DOCUMENTS

| 7,995,378 | B2 * | 8/2011 | Yoon | .................... G11C 11/1659 365/148 |
| 8,355,272 | B2 | 1/2013 | Andre | |
| 8,923,041 | B2 | 12/2014 | Andre et al. | |
| 9,286,218 | B2 | 3/2016 | Andre et al. | |
| 9,472,256 | B1 | 10/2016 | Andre | |
| 9,548,096 | B1 * | 1/2017 | Li | ....................... G11C 11/1659 |
| 2009/0323403 | A1 | 12/2009 | Chen et al. | |
| 2011/0292714 | A1 | 12/2011 | Andre et al. | |
| 2015/0357376 | A1 * | 12/2015 | Seo | ........................ H01L 27/228 257/252 |
| 2016/0300604 | A1 * | 10/2016 | Lee | ..................... G11C 11/1675 |
| 2016/0372174 | A1 * | 12/2016 | Ohsawa | .............. G11C 11/1673 |
| 2016/0372518 | A1 * | 12/2016 | Li | ........................ G11C 11/1659 |
| 2016/0379699 | A1 * | 12/2016 | Takahashi | ........... G11C 11/1673 365/158 |

OTHER PUBLICATIONS

Cargnini, Luis Vitorio et al., "Embedded Memory Hierarchy Exploration Based on Magnetic Random Access Memory," Journal of Low Power Electronics and Applications, Aug. 28, 2014, pp. 214-230, vol. 4.

\* cited by examiner

*Primary Examiner* — Toan K Le

(74) *Attorney, Agent, or Firm* — Bookoff McAndrews, PLLC

(57) ABSTRACT

The present disclosure is drawn to, among other things, a magnetoresistive memory. The magnetoresistive memory includes a first memory cell, a first access circuit, a second access circuit, and a current generating circuit. The first memory cell includes a first magnetic tunnel junction and a second magnetic tunnel junction. The first access circuit is configured to receive access command signals for accessing the first magnetic tunnel junction. The first access circuit includes a first access switch and a second access switch. The second access circuit is configured to receive access command signals for accessing the second magnetic tunnel junction. The second access circuit includes a third access switch and a fourth access switch. The current generating circuit is configured to generate a first write current through the first magnetic tunnel junction and generate a second write current through the second magnetic tunnel junction based on data input signals.

20 Claims, 8 Drawing Sheets

| OPERATIONS | STAND-BY | BOOT | WRITE '1' | WRITE '0' | READ |
|---|---|---|---|---|---|
| WRUPGND_T (453) | ON | ON | ON | - | - |
| WRUPGND_C (463) | ON | ON | - | ON | - |
| WRDNGND_T (452) | ON | ON | - | ON | ON |
| WRDNGND_C (462) | ON | ON | ON | - | ON |
| NFOLUP_T (454) | - | - | - | - | - |
| NFOLUP_C (464) | - | - | - | ON | - |
| NFOLDN_T (451) | - | - | - | ON | - |
| NFOLDN_C (461) | - | - | ON | - | - |
| NFOLSA (481) | - | - | - | - | ON |

FIG. 5

BITLINE CONTROL IN DIFFERENTIAL MAGNETIC MEMORY

TECHNICAL FIELD

The disclosure herein relates generally to spin-torque magnetic memory devices having two select devices and two magnetic tunnel junctions in each memory cell, and more particularly, to circuits and methods for accessing such memory cells for read and write operations.

INTRODUCTION

Spin-torque magnetic random access memory (MRAM) devices store information by controlling the resistance across a magnetic tunnel junction (MTJ) such that a read current through the MTJ results in a voltage drop having a magnitude that is based on the state of the MTJ stack. The resistance in each MTJ can be varied based on the relative magnetic states of the magnetoresistive layers within the MTJ stack. In such memory devices, there is typically a portion of the MTJ stack that has a fixed magnetic state and another portion that has a free magnetic state that is controlled to be in either of two possible states relative to the portion having the fixed magnetic state. Because the resistance through the MTJ changes based on the orientation of the free portion relative to the fixed portion, information can be stored in the MTJ by setting the orientation of the free portion. The information may be later retrieved by sensing the orientation of the free portion.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

FIG. 5 depicts a truth table for accessing a 2T2MTJ memory cell via access switches, according to another aspect of the present disclosure.

Figure 1:
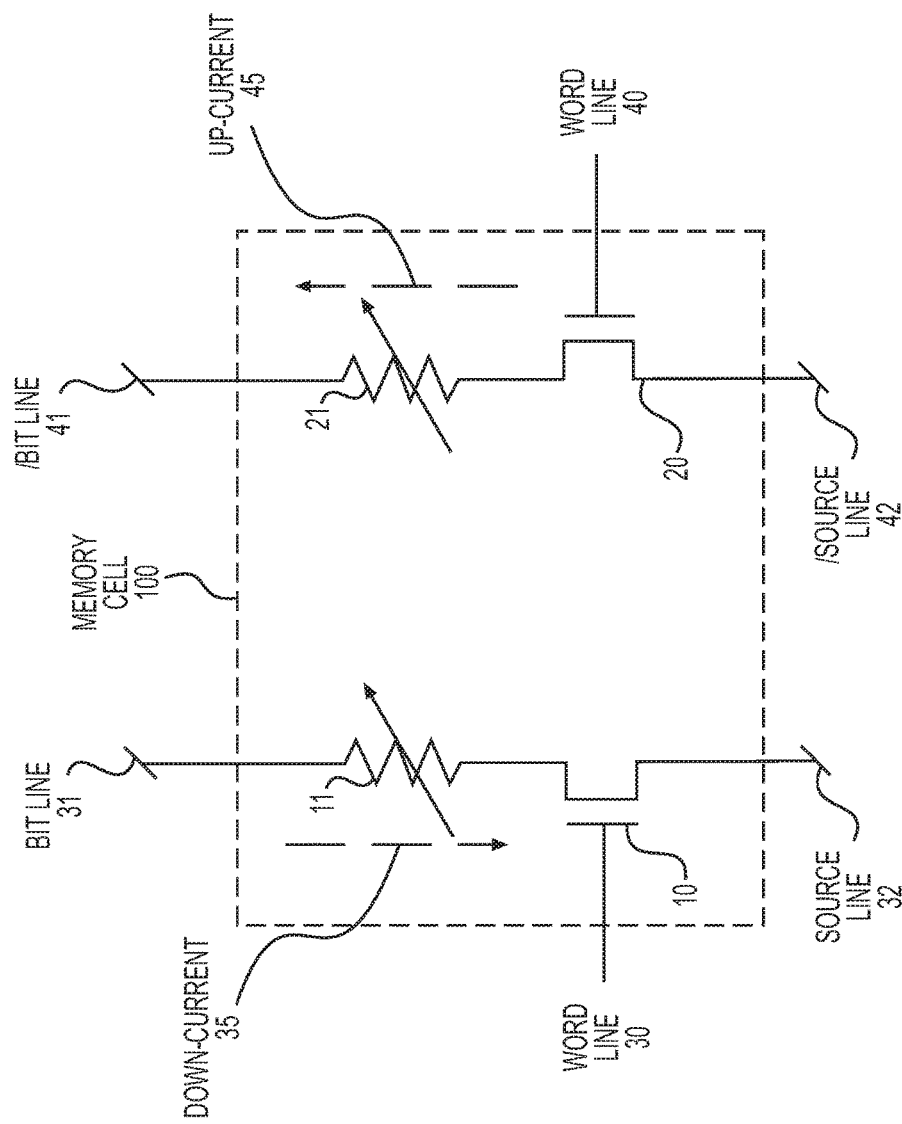
FIG. 1 depicts a schematic diagram of a two-transistor two-magnetic tunnel junction (2T2MTJ) memory cell, according to one aspect of the present disclosure.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved.

In the interest of conciseness, conventional techniques, structures, and principles known by those skilled in the art may not be described herein, including, for example, standard magnetic random access memory (MRAM) process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to accessing (e.g., reading or writing) memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The various embodiments presented herein are based on a magnetic memory device architecture that includes two MTJs and two corresponding select devices (e.g., access transistor) in each memory cell. This may be referred to as a 2T2MTJ memory (or differential MTJ memory) device. Because the resistance through different MTJs can vary significantly, the two MTJs in the memory cell are written to complementary states to store a single bit of information. The bit stored in the memory cell can be readily determined by comparing the states of the two MTJs. This can be more reliable and faster than comparing the resistance of a single MTJ with a reference. In one example of a 2T2MTJ memory cell storing a bit having the value "0", the first MTJ may be in a first state (e.g., a relatively lower resistance), and the second MTJ may be in a second state (e.g., a relatively higher resistance). If the first MTJ is in the second state (e.g., a relatively higher resistance) and the second MTJ is in the first state (e.g., a relatively lower resistance), that can represent the memory cell storing a "1."

As discussed in more detail below, circuits and techniques are presented for accessing (e.g., reading and/or writing) 2T2MTJ memory cells. More specifically, circuits and techniques are presented for using input data signals to generate masked driver control signals.

With reference now to FIG. 1, there is depicted a 2T2MTJ memory cell 100. Memory cell 100 includes a first MTJ 11 coupled in series with a first select device 10 as well as a second MTJ 21 coupled in series with a second select device 20. Each MTJ 11, 12 is coupled to a corresponding select device 10, 20 to allow each MTJ to be individually selected for access. The MTJ 11 and select device 10 are coupled in series between a plurality conductive lines, e.g., a bit line 31 and a source line 32. The bit line 31 and the source line 32 allow for different currents or voltages to be applied to the series circuit formed by the MTJ 11 and select device 10. Similarly, MTJ 21 and select device 20 are coupled in series between /bit line 41 ("bit line bar") and /source line 42 ("source line bar"). In other embodiments, the signal lines used to provide the various voltages and currents to the MTJs may be referred to by names other than "source line" and "bit line." In addition, as will be recognized by those of ordinary skill in the art, the various contemplated signal lines may connect to the MTJs and respective select devices via any suitable electrical connection, including, but not limited to, vias, electrodes, etc. In the present disclosure, the lines used to apply the voltage/current to the MTJs are referred to as "common lines," "bit lines," and "source lines" in order to promote a better understanding of the various inventions disclosed herein.

As noted above, in a 2T2MTJ memory cell, a single data bit is stored by storing complementary states in the two MTJs included in the memory cell. For a read operation, for example, the resistance across MTJ 11 is detected and compared with the resistance across MTJ 21. In some embodiments, this is accomplished by applying a voltage at each of bit line 31 and /bit line 41 while pulling the source line 32 and /source line 42 to a lower voltage (e.g., ground). In other embodiments, a matched current source may be used to apply a known current through each of the MTJs 11, 21. The resulting currents from the voltage applied across the MTJs can be compared to determine which MTJ has a relatively higher resistance. Similarly, for embodiments that drive a matched current through the MTJs 11, 21, the voltage drop across each of the two MTJs 11, 21 can be compared to determine the data bit stored in the memory cell.

Word lines 30 and 40, which are coupled to the gates of select devices 10 and 20, respectively, are used to control the access to MTJs 11, 21. When the gates of the select devices 10, 20 are driven high, current is allowed to flow through MTJs 11, 21. For a read operation, for example, each of word lines 30, 40 may be driven to the same voltage level such that the voltage/current through each of MTJs 11, 21 is presented with the same biasing with respect to the select devices 10, 20, thereby enabling an accurate comparison of the states of the two MTJs 11, 21. The comparison of the state of the two MTJs 11, 21 may be performed by a read circuit, where one example of such a read circuit may include a sense amplifier configured to sense the difference between the states of MTJs 11, 21, and is further configured to determine the single bit represented by those stored states. Because MTJs 11, 21 store complementary states, the comparison is simple in that one MTJ (e.g., MTJ 11) will have a relatively higher resistance than the other MTJ (e.g., MTJ 12). As such, the magnitude of the resistance difference is less important than in other non-2T2MTJ memory devices.

In a spin-torque magnetic memory, writing a state to MTJs 11, 21 may be accomplished by sending a spin-polarized write current through MTJs 11, 21, such that the angular momentum carried by the spin-polarized current can change the magnetic state of the free portion MTJs 11, 21. One of ordinary skill in the art understands that such a current can either be directly driven through the MTJs or can be the result of applying one or more voltages across the MTJ, where the applied voltages result in the desired current. Depending on the direction of the current through the MTJ, the resulting magnetization of the free portion will either be in the first state or the second state (which is opposite to the first state). In such memories, therefore, the magnitude of the write current may be typically greater than the magnitude of a read current used to sense the information stored in the memory cells (e.g., MTJs 11, 21). In the case of a two-MTJ memory cell, storing a bit in the memory cell requires two opposite currents to be passed through the two MTJs (e.g., MTJs 11, 21) in order to store the two different states in those MTJs.

In the example illustrated in FIG. 1, a down-current 35 may be sent through MTJ 11, whereas an up-current 45 may be sent through MTJ 21. Thus, in the example illustrated, MTJ 11 is being written to a relatively low resistance state, whereas the MTJ 21 is being written to a relatively higher resistance state. In other embodiments, a down-current write can correspond to storing a relatively higher resistance state and an up-current write can correspond to storing a relatively lower resistance state.

Figure 2:
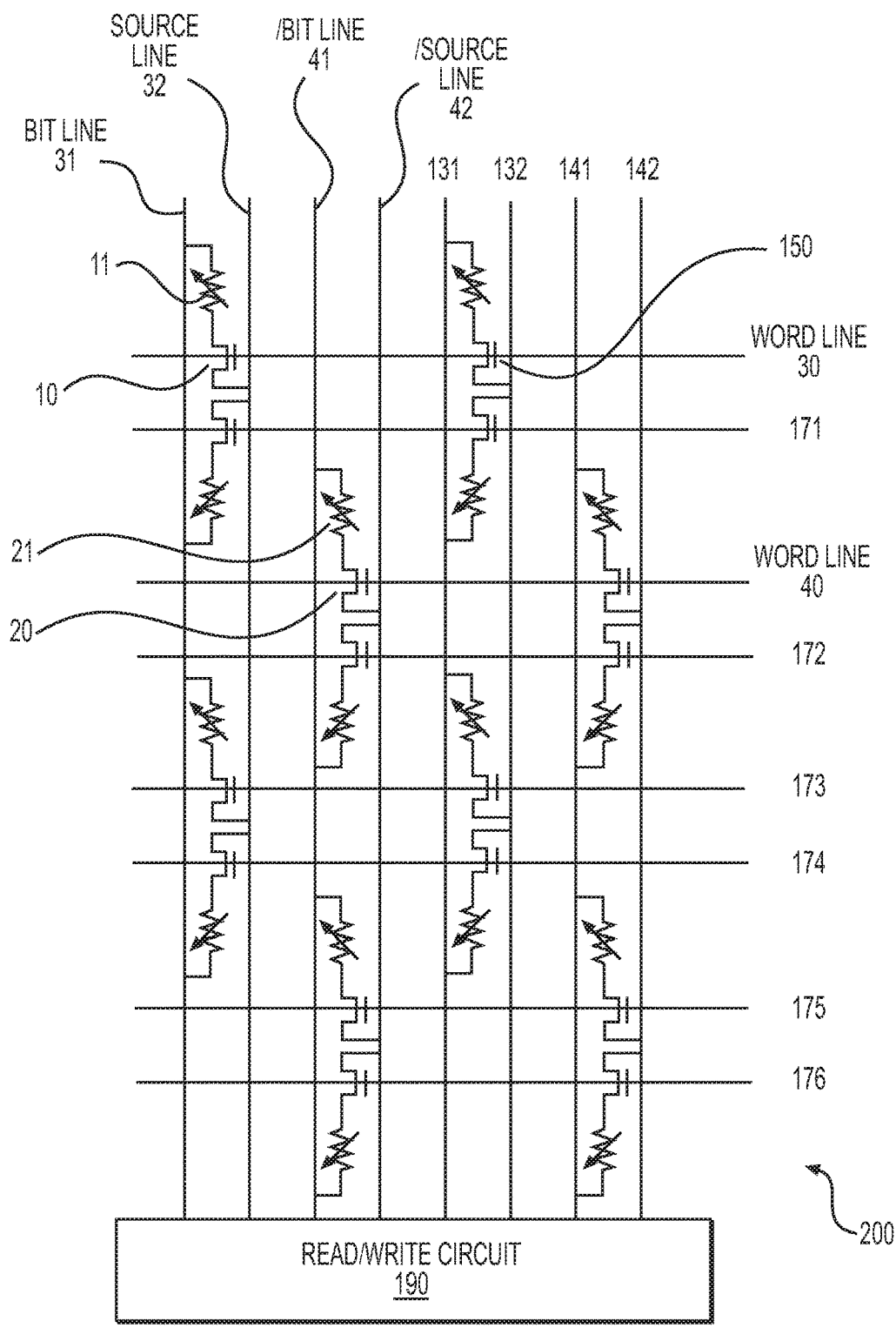
FIG. 2 depicts a schematic diagram of a portion of a magnetic memory device that includes 2T2MTJ memory cells, according to another aspect of the present disclosure.

With reference now to FIG. 2, there is a schematic diagram of a portion of a magnetic memory device 200 that includes a plurality of 2T2MTJ memory cells, including e.g., memory cell 100 of FIG. 1. As shown, a first half of the memory cell 100 includes MTJ 11 and select device 10 coupled between bit line 31 and source line 32. The gate of select device 10 is coupled to word line 30. As shown, additional MTJs and select devices are coupled to bit line 31, source line 32, and word line 30. However, by controlling the respective voltages on the bit lines, source lines, and word lines, each MTJ in the array can be individually selected for read and write operations. Read/write circuit 190 includes the drivers to drive the bit and source lines as well as the read circuitry used to determine the states of the MTJs and resulting data bits stored in the memory cells.

The complementary half of memory cell 100 includes MTJ 21 and select device 20, which are coupled in series between /bit line 41 and /source line 42. Word line 40 is coupled to the gate of the select device 20. FIG. 2 illustrates a total of eight memory cells arranged in four columns, where the first half of each memory cell is included in a column neighboring the second half of the memory cell. Thus, select device 10 is included in a first plurality of select devices in the first column, all of which are coupled to source line 32. Select device 20 is included in a second plurality of select devices in the second column, all of which are coupled to /source line 42. The neighboring columns can be labeled as even/odd columns, where a single select device for each memory cell is provided in an even column and another select device is provided in an odd (or otherwise adjacent) column.

In an example operation, the single bit stored in the memory cell 100 can be determined during a read operation by comparing the relative states of MTJs 11 and 12. In order to perform the comparison, the read/write circuit 190 may selectively drive bit line 31, source line 32, /bit line 41, and /source line 42. The bit lines and source lines that are driven is based on address information received by the memory device, where the address information may be decoded and used to determine those cells that are to be accessed. If, for example, memory cell 100 is included in the page to be accessed, the read/write circuit 190 will use the decoded address to selectively drive those bit lines and source lines suitable for accessing MTJs 11 and 21. In FIG. 2, the bit line 31 and source line 32 pair is shown in neighboring proximity to the /bit line 41 and /source line 42 pair. However, in an alternative embodiment, the respective lines for each of the pairs may be located in different segments or locations of the array. The true bit of 2T2MJ may be located in a first segment of the array while the complement bit may be located in a different segment of the array. This would allow for a more flexible and compact configuration in which MTJs are arranged in every wordline row and column.

When the data bit stored in memory cell 100 is to be read or otherwise accessed, word lines 30 and 40 may be driven to a word line voltage suitable for a reading operation, while the other word lines (e.g., word lines 171-176) included in the array may be maintained at the low voltage supply (VSS), which, in some aspects, may be ground. In some embodiments, the voltage applied to word lines 30 and 40 for a reading operation may correspond to a power supply voltage used for other logic on the memory device (logic supply voltage). In other embodiments, the voltage applied to word lines 30 and 40 for a reading operation may correspond to one of the word line voltages that is also used during write operations, where the word line voltages are different in magnitude than the logic supply voltage. In one example embodiment, the voltage applied on a word line corresponding to a down-current write may be driven onto both word lines 30 and 44 during a read operation.

Once word lines 30 and 40 are driven to the appropriate voltage, bit line 31 and /bit line 41 may be driven to a first voltage, and then source line 32 and /source line 42 may be driven to a second voltage, which may be lower than the first voltage. Even though bit line 31 is at a relatively high voltage and source line 32 is at a relatively low voltage, current will only flow through MTJ 11 in the first column of the array depicted in FIG. 2 because all of the other word lines 171-176 are held low, thereby preventing current flow through the other select devices and MTJs included in the first column. Similarly, word line 40 only enables current flow through select device 20 and MTJ 21 in the second column. Although word line 30 also turns on the select device 150 in the third column, bit line 131 and source line 132 are controlled by the read/write circuit 190 such that no significant current flows through select device 150.

Figure 3:
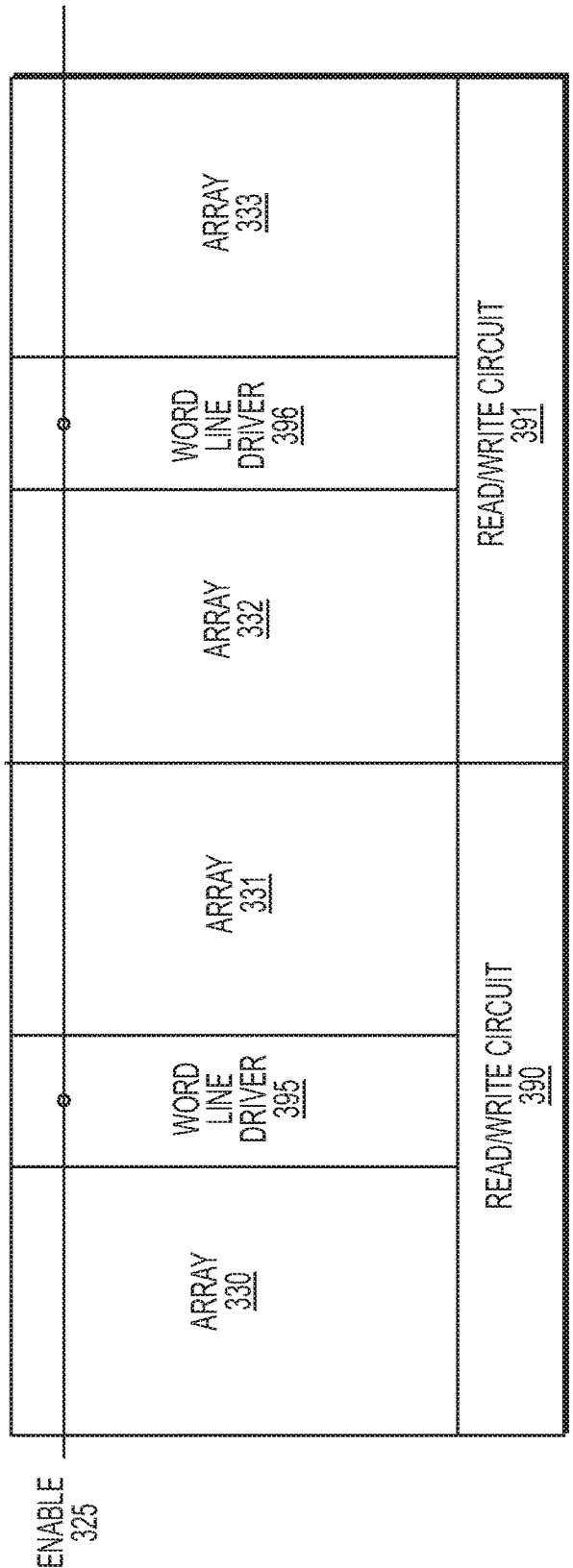
FIG. 3 depicts a block diagram of a portion of a magnetic memory device that includes 2T2MTJ memory cells, according to another aspect of the present disclosure.

With reference now to FIG. 3, there is depicted a block diagram of a portion of a magnetic memory device that includes a plurality of read/write circuits 390, 391. Read/write circuit 390 is coupled to arrays 330 and 331 and provides the appropriate voltages on any bit lines and source lines used to perform read/write operations in the arrays 330 and 331. Word line driver 395 receives enable signal 325 and generates the appropriate word line voltages for the arrays 330 and 331 used for the read/write operations. Read/write circuit 391, arrays 332, 333, and word line driver 396 are similar to read/write circuit 390, arrays 330, 331, and word line driver 395, respectively.

As alluded to above, word line drivers 395 and 396 are configured to receive enable signal 325, which may be a global decode signal corresponding to higher-order address bits received by the memory device. The enable signal 325 provides an indication as to whether memory cells included in a portion of arrays 330-333 are to be accessed for a particular operation. Additional address signals may be provided to circuitry that includes the word line drivers 395, 396 and read/write circuits 390, 391, to, for example, allow for local decoding that determines which word lines, bit lines, and source lines are to be driven for a particular operation. The local decoding controls the selective driving of the bit lines and source lines in the respective arrays by the read/write circuits 390, 391 as well as controlling the sense amplifiers selective coupling to, or sensing of, the memory cells in the arrays 330-333 for determination of data bits stored therein.

Figure 4:
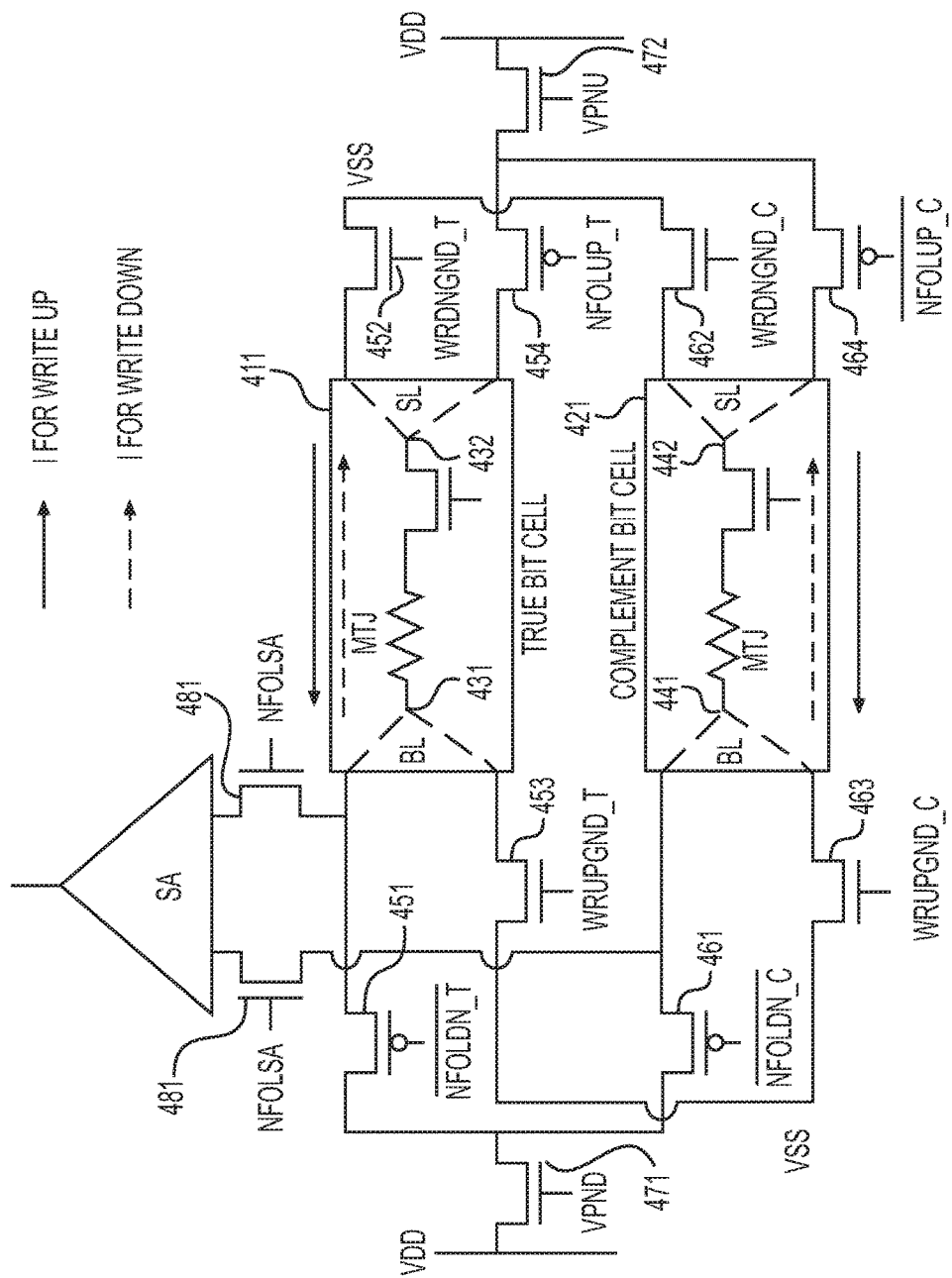
FIG. 4 depicts another embodiment of a 2T2MTJ memory cell with access switches, according to another aspect of the present disclosure.

With reference now to FIG. 4, there is depicted a 2T2MTJ memory cell with a true bit cell 411 and a complement bit cell 421 (as discussed above with reference to FIG. 1). Each end of the true bit cell 411 and complement bit cell 421 may be coupled to access switches for connecting the bit cells to appropriate voltage sources when reading and/or writing data to the bit cells. For example, the bit line side 431 of true bit cell 411 may be coupled to access switch 451 and to access switch 453. Access switch 451 may be configured to couple bit line side 431 to a high voltage supply (VDD), whereas access switch 453 may be configured to couple bit line side 431 to a low voltage supply (VSS). Conversely, the source line side 432 of true bit cell 411 may be coupled to access switch 452 and to access switch 454. Access switch 452 may be configured to couple source line side 432 to a low voltage supply (VSS), whereas access switch 454 may be configured to couple source line side 432 to a high voltage supply (VDD). It is to be appreciated that for each of the access switches, 451-454, a complement version of the devices may be used instead of what is illustrated. For example, access switch 451 is shown as a p-type metal oxide semiconductor (PMOS) switching device. However, a complement version n-type metal oxide semiconductor (NMOS) switching device may be used to couple each end of the bit cells to the respective supply voltages.

Complement bit cell 421 may be similarly coupled to access switches for coupling to appropriate voltage sources when reading and/or writing data to the bit cells. For example, bit line side 441 of complement bit cell 421 may be coupled to access switch 461 and to access switch 463. Access switch 461 may be configured to couple bit line side 441 to a high voltage supply (VDD), whereas access switch 463 may be configured to couple bit line side 441 to a low voltage supply (VSS). Conversely, the source line side 442 of complement bit cell 421 may be coupled to access switch 462 and to access switch 464. Access switch 462 may be configured to couple source line side 442 to a low voltage supply (VSS), whereas access switch 464 may be configured to couple the source line side 442 to a high voltage supply (VDD). It is to be appreciated that for each of the access switches, 461-464, a complement version of the devices may be used instead of what is illustrated. For example, access switch 461 is shown as a p-type metal oxide semiconductor (PMOS) switching device. However, a complement version n-type metal oxide semiconductor (NMOS) switching device may be used to couple each end of the bit cells to the respective supply voltages.

It is to be appreciated that other access switches may be coupled to true bit cell 411 and complement bit cell 421. For example, boot transistors (e.g., column selection devices) may be coupled to each of bit line sides 431, 441, and source line sides 432, 442, of true bit cell 411 and complement bit cell 421, respectively. Boot transistors may allow for the selection of one bit line and source line pair out of a plurality of bit line and source line pairs associated with arrays 330-333. In some embodiments, a high gate voltage may be applied to the gates of the boot transistors during a boot mode. In other embodiments, the gates of the boot transistors may be allowed to float during read or write operations. In yet other embodiments, the gates of the boot transistors may be driven to a high gate voltage during read or write operations.

Each of the access switches, 451-454 and 461-464, may be turned ON and OFF according to modes of operation of the 2T2MTJ memory cell. For example, during a stand-by mode of the 2T2MTJ memory cell, the states of each of the MTJs may be retained because there is no current flowing through the MTJs. During a boot mode, column selection device gates may be charged prior to a read or write operation to the 2T2MTJ memory cell. During a write operation, complement values are written to each of the true bit cell and complement bit cells of the 2T2MTJ memory cell. During a read operation, a sense amplifier may be connected to each of the MTJs for reading the data values stored in the 2T2MTJ memory cell.

Turning now to FIG. 5, a truth table outlines which of the access switches, 451-454 and 461-464, may be turned ON for each of the respective modes of operation. Notably, each of the access switches described in FIG. 5 corresponds to the access switches described above with reference to FIG. 4. For example, during a stand-by mode, access switches 452, 453, 462, and 463 may all be turned ON. With access switches 452 and 453 turned ON, each of the bit line side 431 and source line side 432 of true bit cell 411 are coupled down to a low supply voltage (VSS). Similarly, with access switches 462 and 463 turned ON, each of the bit line side 441 and source line side 442 of complement bit cell 421 are coupled down to a low supply voltage (VSS). In some embodiments, the low supply voltage (VSS) may be a ground voltage. With each side of the true bit cell 411 and complement bit cell 421 pulled down to VSS (e.g., ground voltage), each of their respective data states may be retained without disturbance because there is no current flowing through each of the MTJs.

During a boot mode, access switches 452, 453, 462, and 463 may all be similarly turned ON as with the stand-by mode. During the boot mode, column selection device gates may be charged and/or wordline selection devices may be enabled prior to a read or write operation. With access switches 452 and 453 turned ON, each of the bit line side 431 and source line side 432 of true bit cell 411 is coupled down to a low supply voltage (VSS). With access switches 462 and 463 turned ON, each of the bit line side 441 and source line side 442 of complement bit cell 421 are coupled down to a low supply voltage (VS S). With each side of the true bit cell 411 and complement bit cell 421 pulled down to VSS (e.g., ground voltage), each of their respective data states may be retained without disturbance during the boot mode.

With continued reference to FIG. 5, the depicted truth table outlines the access cells that may be turned ON to write a "1" to the 2T2MTJ memory cell. For example, access switches 453, 454, 461, and 462 may all be turned ON to write a "1" to the 2T2MTJ memory cell. Notably, when writing a "1" value to true bit cell 411, a complement "0" value (or opposite state) is stored in complement bit cell 421. With access switches 453 and 454 turned ON, bit line side 431 of true bit cell 411 may be coupled to a low supply voltage (VSS), and source line side 432 of true bit cell 411 may be coupled to a high supply voltage (VDD) via access gate 472. Thus, the voltage differential between VDD and VSS generates a write-up current for storing a "1" value in true bit cell 411. With access switches 461 and 462 turned ON, bit line side 441 of complement bit cell 421 may be coupled to a high supply voltage (VDD) via access switch 471, and source line side 442 of complement bit cell 421 may be coupled to a low supply voltage (VSS). Thus, the voltage differential between VDD and VSS generates a write-down current for storing a "0" value in complement bit cell 421.

The truth table in FIG. 5 further outlines the access cells that may be turned ON to write a "0" to the 2T2MTJ memory cell. For example, access switches 451, 452, 463, and 464 may all be turned ON to write a "0" to the 2T2MTJ memory cell. Notably, when writing a "0" value to true bit cell 411, a complement "1" value (or opposite state) is stored in complement bit cell 421. With access switches 451 and 452 turned ON, bit line side 431 of true bit cell 411 may be coupled to a high supply voltage (VDD) via access switch 471, and source line side 432 of true bit cell 411 may be coupled to a low supply voltage (VSS). Access switch 471 may be selectively turned ON via signal VPND to control the voltage differential between VDD and VSS. Thus, the voltage differential between VDD and VSS generates a write-down current for storing a "0" value in true bit cell 411. With access switches 463 and 464 turned ON, bit line side 441 of complement bit cell 421 may be coupled to a low supply voltage (VSS), and source line side 442 of complement bit cell 421 may be coupled to a high supply voltage (VDD) via access switch 472. Access switch 472 may be selectively turned ON via signal VPNU to control the voltage differential between VDD and VSS. Thus, the voltage differential between VDD and VSS generates a write-up current for storing a "1" value in complement bit cell 421.

The truth table in FIG. 5 further outlines the access cells that may be turned ON to read the values stored in the 2T2MTJ memory cell. For example, access switches 452, 462, and 481 may all be turned ON to read the value stored in the 2T2MTJ memory cell. With access switches 452 and 462 turned ON, both the source line side 432 of true bit cell 411 and the source line side 442 of complement bit cell 421 may be coupled to a low supply voltage (VSS). With access switches 481 turned ON, a sense amplifier may be able to read the differential voltage between bit line side 441 and bit line side 431.

Figure 6:
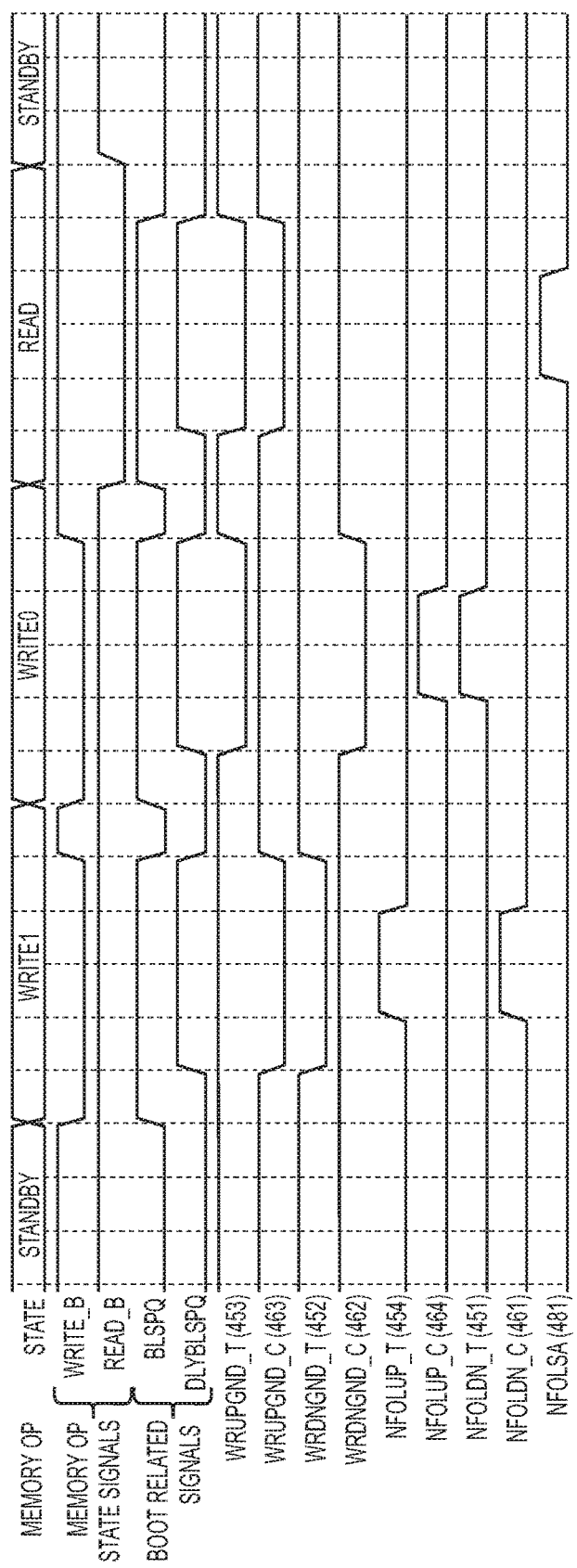
FIG. 6 depicts a timing diagram for a 2T2MTJ memory cell and corresponding access switches, according to another aspect of the present disclosure.

With reference now to FIG. 6, there is depicted an example timing diagram for each of the access switches that are turned ON for each of the modes of operation described above. For example, during a stand-by mode, access switches 452, 453, 462, and 463 may all be turned ON to prevent any current flow through the MTJs and reduce any data bit disturbance. With access switches 452 and 453 turned ON, each of the bit line side 431 and source line side 432 of true bit cell 411 are coupled down to a low supply voltage (VS S). Similarly, with access switches 462 and 463 turned ON, each of the bit line side 441 and source line side 442 of complement bit cell 421 are coupled down to a low supply voltage (VS S).

The timing diagram in FIG. 6 further illustrates the access cells that may be turned ON when writing a "1" and a "0" to the 2T2MTJ memory cell. For example, access switches 453, 454, 461, and 462 may all be turned ON to write a "1" to the 2T2MTJ memory cell. Notably, as discussed above with reference to FIG. 4, when writing a "1" value to true bit cell 411, a complement "0" value may be stored in complement bit cell 421. On the other hand, access switches 451, 452, 463, and 464 may all be turned ON to write a "0" to the 2T2MTJ memory cell. As discussed above with reference to FIG. 4, when writing a "0" value to true bit cell 411, a complement "1" value may be stored in complement bit cell 421.

The timing diagram in FIG. 6 further illustrates the access cells that may be turned ON when reading the values stored in the 2T2MTJ memory cell. For example, access switches 452, 462, and 481 may all be turned ON to read the stored value in the 2T2MTJ memory cell. With access switches 452 and 462 turned ON, both the source line side 432 of true bit cell 411 and the source line side 442 of complement bit cell 421 may be coupled to a low supply voltage (VSS). With access switches 481 turned ON, a sense amplifier may be able to read the differential voltage between bit line side 441 and bit line side 431.

Figure 7:
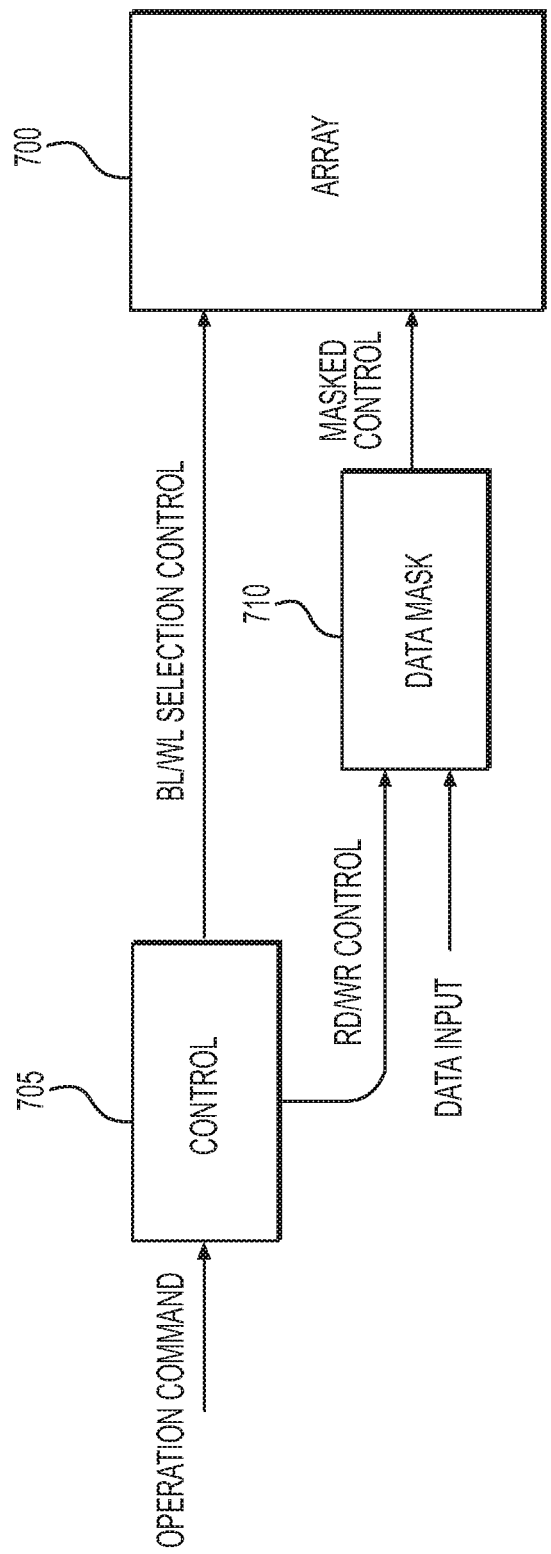
FIG. 7 depicts a schematic diagram of a data mask for controlling the reading and/or writing to a 2T2MTJ memory cell, according to another aspect of the present disclosure.
Figure 8:
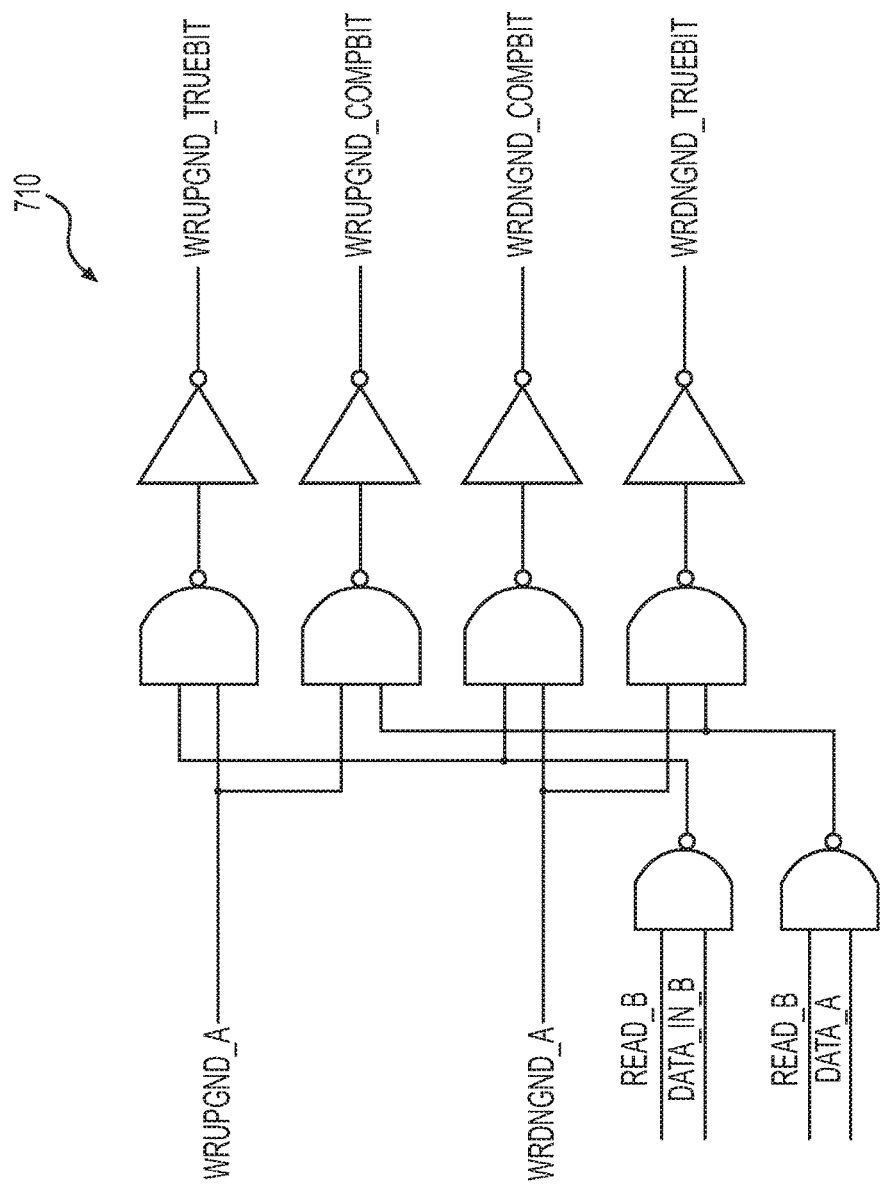
FIG. 8 depicts yet another schematic diagram of a data mask for controlling the reading and/or writing to a 2T2MTJ memory cell, according to another aspect of the present disclosure.

With reference now to FIG. 7, there is depicted a circuit diagram in which operation command signals are input to control device 705, from which bit line and/or word line selection control signals are input directly to an array 700. From control device 705, read and/or write control signals are input to data mask 710. Data mask 710 receives the read and/or write control signals, along with data input signals (e.g., data information to be stored in array 700) to generate masked control signals. The masked control signals may be generated to control the current flow through the complementary bit cell that has been selected based on the data input. In FIG. 8, for example, there is depicted a data mask 710, according to one aspect of the present disclosure. In one embodiment, WRUPGND_A and WRDNGND_A command signals are combined with input data information (e.g., DATA_A, DATA_IN_B) to generate masked control signals (e.g., WRUPGND_TRUEBIT, WRUPGRND_CO-MPBIT, WRDNGND_COMPBIT, and WRDNGND_TRUEBIT). The command signals and the input data information are input to an array of NAND devices and inversion devices to generate the masked control signals. The masked control signals may be used to control the access switches (e.g., access switches, 451-454 and 461-464) as discussed above with reference to FIG. 4. It is to be appreciated that other logic devices (such as, e.g., AND, OR, NOR, etc. devices) may be used in combination to generate the masked control signals from data mask 710.

In another embodiment of the present disclosure, a test mode may be defined for a write operation. The test mode may allow writing to either one of a true bit or complement bit to a known state while the other of a true bit or complement bit may not be written to at all. A write current then may be calibrated based on the known state. The test mode may be implemented by gating the NFOLUP_C, NFOLUP_T, NFOLDN_C, and NFOLDN_T signals (e.g., access gates 451, 454, 461, and 464), as discussed above with reference to FIG. 4.

While much of the discussion above focuses on reading and writing to a single memory cell 100 in various scenarios, the memory devices that include such memory cells typically include a large number of such memory cells, where many memory cells are accessed together for read and write operations. Therefore, multiple read circuits are typically included on such memory devices, where a first read circuit performs the comparison and stored bit determination for one memory cell and a second read circuit performs the comparison and stored bit determination for another memory cell. In some embodiments, the first and second memory cells are accessed using the same two word lines, whereas in other embodiments, a first and second word line are used to access the first memory cell while a third and fourth word line are used to access the second memory cell. The same enable signal or separate, more local enable signals can be used to control the word line assertion as well as the assertion of any common lines used in accessing the first and second memory cells.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

The foregoing description of the inventions has been described for purposes of clarity and understanding. It is not intended to limit the inventions to the precise form disclosed. Various modifications may be possible within the scope and equivalence of the application.

We claim:

1. A magnetoresistive memory, comprising:
a first memory cell that includes:
a first select device;
a first magnetic tunnel junction coupled in series with the first select device;
a second select device; and
a second magnetic tunnel junction coupled in series with the second select device,
wherein the first memory cell is configured to store a single bit by storing complementary states in the first and second magnetic tunnel junctions;
a first access circuit configured to receive access command signals for accessing the first magnetic tunnel junction, wherein the first access circuit includes a first access switch and a second access switch;
a second access circuit configured to receive access command signals for accessing the second magnetic tunnel junction, where the second access circuit includes a third access switch and a fourth access switch; and
a current generating circuit coupled to the first and second magnetic tunnel junctions, wherein, based on data input signals, the current generation circuit is configured to generate (i) a first write current through the first magnetic tunnel junction and (ii) a second write current through the second magnetic tunnel junction based on data input signals.

2. The magnetoresistive memory of claim 1, wherein, during a stand-by mode, the first access switch and the second access switch are configured to couple a first end and a second end of the first magnetic tunnel junction to a low voltage supply, and wherein the third access switch and the fourth access switch are configured to couple a first end and a second end of the second magnetic tunnel junction to a low voltage supply.

3. The magnetoresistive memory of claim 1, wherein, during a boot mode, the first access switch and the second access switch are configured to couple a first end and a second end of the first magnetic tunnel junction to a low voltage supply, and wherein the third access switch and the fourth access switch are configured to couple a first end and a second end of the second magnetic tunnel junction to a low voltage supply.

4. The magnetoresistive memory of claim 1, wherein, when storing a "1" in the first memory cell, the first access switch is configured to couple a first end of the first magnetic tunnel junction to a low voltage supply, the second access switch is configured to couple a second end of the first magnetic tunnel junction to a high voltage supply, the third access switch is configured to couple a first end of the second magnetic tunnel junction to a high voltage supply, and the fourth access switch is configured to couple a second end of the second magnetic tunnel junction to a low voltage supply.

5. The magnetoresistive memory of claim 1, wherein, when storing a "0" in the first memory cell, the first access switch is configured to couple a first end of the first magnetic tunnel junction to a high voltage supply, the second access switch is configured to couple a second end of the first magnetic tunnel junction to a low voltage supply, the third access switch is configured to couple a first end of the second magnetic tunnel junction to a low voltage supply, and the fourth access switch is configured to couple a second end of the second magnetic tunnel junction to a high voltage supply.

6. The magnetoresistive memory of claim 1, wherein, when reading a value stored in the first memory cell, the first access switch is configured to couple a first end of the first magnetic tunnel junction to a low voltage supply, a fifth access switch is configured to couple a second end of the first magnetic tunnel junction to a sense amplifier, the third access switch is configured to couple a first end of the second magnetic tunnel junction to a low voltage supply, and a sixth access switch is configured to couple a second end of the second magnetic tunnel junction to the sense amplifier.

7. A magnetoresistive memory, comprising:
a first memory cell that includes:
a first select device;
a first magnetic tunnel junction coupled in series with the first select device;
a second select device; and
a second magnetic tunnel junction coupled in series with the second select device, wherein the first memory cell is configured to store a single bit by storing complementary states in the first and second magnetic tunnel junctions;
a first access circuit configured to receive access command signals for accessing the first magnetic tunnel junction, wherein the first access circuit includes a first access switch and a second access switch;
a second access circuit configured to receive access command signals for accessing the second magnetic tunnel junction, wherein the second access circuit includes a third access switch and a fourth access switch, and wherein the first access switch, the second access switch, the third access switch, and the fourth access switch are enabled from masked control signals; and
a current generating circuit coupled to the first and second magnetic tunnel junctions, wherein, based on data input signals, the current generation circuit is configured to generate (i) a first write current through the first magnetic tunnel junction and (ii) a second write current through the second magnetic tunnel junction.

8. The magnetoresistive memory of claim 7, wherein, during a stand-by mode, the first access switch and the second access switch are configured to couple a first end and a second end of the first magnetic tunnel junction to a low voltage supply, and wherein the third access switch and the fourth access switch are configured to couple a first end and a second end of the second magnetic tunnel junction to a low voltage supply.

9. The magnetoresistive memory of claim 7, wherein, during a boot mode, the first access switch and the second access switch are configured to couple a first end and a second end of the first magnetic tunnel junction to a low voltage supply, and wherein the third access switch and the fourth access switch are configured to couple a first end and a second end of the second magnetic tunnel junction to a low voltage supply.

10. The magnetoresistive memory of claim 7, wherein, when storing a "1" in the first memory cell, the first access switch is configured to couple a first end of the first magnetic tunnel junction to a low voltage supply, the second access switch is configured to couple a second end of the first magnetic tunnel junction to a high voltage supply, the third access switch is configured to couple a first end of the second magnetic tunnel junction to a high voltage supply, and the fourth access switch is configured to couple a second end of the second magnetic tunnel junction to a low voltage supply.

11. The magnetoresistive memory of claim 7, wherein, when storing a "0" in the first memory cell, the first access switch is configured to couple a first end of the first magnetic tunnel junction to a high voltage supply, the second access switch is configured to couple a second end of the first magnetic tunnel junction to a low voltage supply, the third access switch is configured to couple a first end of the second magnetic tunnel junction to a low voltage supply, and the fourth access switch is configured to couple a second end of the second magnetic tunnel junction to a high voltage supply.

12. The magnetoresistive memory of claim 7, wherein, when reading a value stored in the first memory cell, the first access switch is configured to couple a first end of the first magnetic tunnel junction to a low voltage supply, a fifth access switch is configured to couple a second end of the first magnetic tunnel junction to a sense amplifier, the third access switch is configured to couple a first end of the second magnetic tunnel junction to a low voltage supply, and a sixth access switch is configured to couple a second end of the second magnetic tunnel junction to the sense amplifier.

13. A magnetoresistive memory, comprising:
a first memory cell that includes:
  a first select device;
  a first magnetic tunnel junction coupled in series with the first select device;
  a second select device; and
  a second magnetic tunnel junction coupled in series with the second select device, wherein the first memory cell is configured to store a single bit by storing complementary states in the first and second magnetic tunnel junctions;
a first access circuit configured to receive access command signals for accessing the first magnetic tunnel junction, wherein the first access circuit includes a first access switch and a second access switch;
a second access circuit configured to receive access command signals for accessing the second magnetic tunnel junction, wherein the second access circuit includes a third access switch and a fourth access switch, and wherein the first access switch, the second access switch, the third access switch, and the fourth access switch are enabled from masked control signals; and
a current generating circuit coupled to the first and second magnetic tunnel junctions, wherein the current generation circuit configured to generate (i) a first write current through the first magnetic tunnel junction and (ii) a second write current through the second magnetic tunnel junction based on data input signals, wherein the data input signals are configured to generate the masked control signals.

14. The magnetoresistive memory of claim 13, wherein, during a stand-by mode, the first access switch and the second access switch are configured to couple a first end and a second end of the first magnetic tunnel junction to a low voltage supply, and wherein the third access switch and the fourth access switch are configured to couple a first end and a second end of the second magnetic tunnel junction to a low voltage supply.

15. The magnetoresistive memory of claim 13, wherein, during a boot mode, the first access switch and the second access switch are configured to couple a first end and a second end of the first magnetic tunnel junction to a low voltage supply, and wherein the third access switch and the fourth access switch are configured to couple a first end and a second end of the second magnetic tunnel junction to a low voltage supply.

16. The magnetoresistive memory of claim 13, wherein, when storing a "1" in the first memory cell, the first access switch is configured to couple a first end of the first magnetic tunnel junction to a low voltage supply, the second access switch is configured to couple a second end of the first magnetic tunnel junction to a high voltage supply, the third access switch is configured to couple a first end of the second magnetic tunnel junction to a high voltage supply, and the fourth access switch is configured to couple a second end of the second magnetic tunnel junction to a low voltage supply.

17. The magnetoresistive memory of claim 13, wherein, when storing a "0" in the first memory cell, the first access switch is configured to couple a first end of the first magnetic tunnel junction to a high voltage supply, the second access switch is configured to couple a second end of the first magnetic tunnel junction to a low voltage supply, the third access switch is configured to couple a first end of the second magnetic tunnel junction to a low voltage supply, and the fourth access switch is configured to couple a second end of the second magnetic tunnel junction to a high voltage supply.

18. The magnetoresistive memory of claim 13, wherein, when reading a value stored in the first memory cell, the first access switch is configured to couple a first end of the first magnetic tunnel junction to a low voltage supply, a fifth access switch is configured to couple a second end of the first magnetic tunnel junction to a sense amplifier, the third access switch is configured to couple a first end of the second magnetic tunnel junction to a low voltage supply, and a sixth access switch is configured to couple a second end of the second magnetic tunnel junction to the sense amplifier.

19. The magnetoresistive memory of claim 13, wherein the command signals and the data input signals are input to an array of logic devices to generate the masked control signals.

20. The magnetoresistive memory of claim 13, wherein the command signals and the data input signals are input to an array of NAND devices and inversion devices to generate the masked control signals.

* * * * *